(12) United States Patent
Tillotson

(10) Patent No.: US 7,031,160 B2
(45) Date of Patent: Apr. 18, 2006

(54) MAGNETICALLY ENHANCED CONVECTION HEAT SINK

(75) Inventor: Brian J. Tillotson, Kent, WA (US)

(73) Assignee: The Boeing Company, Chicago, IL (US)

( * ) Notice: Subject to any disclaimer, the term of this patent is extended or adjusted under 35 U.S.C. 154(b) by 231 days.

(21) Appl. No.: 10/684,104

(22) Filed: Oct. 7, 2003

(65) Prior Publication Data
US 2005/0073814 A1 Apr. 7, 2005

(51) Int. Cl.
*H05K 7/20* (2006.01)
(52) U.S. Cl. .............. 361/704; 165/185; 257/707; 257/713; 361/690; 361/710
(58) Field of Classification Search ........... 165/80.3, 165/185; 257/706–707, 712–713; 361/688–690, 361/704, 707, 710, 714, 717–720
See application file for complete search history.

(56) References Cited

U.S. PATENT DOCUMENTS

| | | | |
|---|---|---|---|
| 4,150,440 A | * | 4/1979 | Bonnie et al. ............... 365/2 |
| 4,830,703 A | | 5/1989 | Matsutani |
| 4,910,742 A | | 3/1990 | Meinhardt |
| 5,349,921 A | | 9/1994 | Barraclough et al. |
| 5,394,936 A | * | 3/1995 | Budelman ............ 165/104.33 |
| 5,462,685 A | | 10/1995 | Raj et al. |
| 6,019,165 A | * | 2/2000 | Batchelder ............... 165/80.3 |
| 6,159,271 A | | 12/2000 | Tillotson et al. |
| 6,162,364 A | | 12/2000 | Tillotson et al. |
| 6,648,064 B1 | * | 11/2003 | Hanson ..................... 165/120 |
| 2004/0046248 A1 | * | 3/2004 | Waelti et al. ............... 257/712 |

FOREIGN PATENT DOCUMENTS

EP  0000856  * 2/1979  ............ 361/714

OTHER PUBLICATIONS

*Magnetothermal Convection in Nonconducting Diamagnetic And Paramagnetic Fluids*, by Boyd F. Edwards, Donald D. Gray, and Jie Huang, six pages.
*Magnetically controlled convection in a paramagnetic fluid* by D. Braithwaite, E. Beaugnon & R. Tournier, Letters To Nature, vol. 354, Nov. 14, 1991, pp. 134-136.
*Convective Specific Heat Transfer In Diamagnetic And Paramagnetic Gases In Presence Of Magnetic And Electro-Magnetic Field* by M.F. Haque and S. Arajs, J. Fiz. (1994), pp. 27-36.

(Continued)

*Primary Examiner*—Gregory D Thompson
(74) *Attorney, Agent, or Firm*—Thompson Coburn, LLP

(57) ABSTRACT

A magnetically enhanced convection heat sink comprises a heat sink member for dissipating heat from a heat source. A magnetic source creates a magnetic field concentrated at a first location, the intensity of the magnetic field decreasing from the first location to a second location. The heat sink member is positioned within the magnetic field and in a gas flow path between the first and second locations. Gas, having paramagnetic properties, entering the heat sink at the first location is heated by the heat sink member, and as the gas becomes warmer is displaced by cooler gas causing the warmer gas to move toward the second location as it is further heated by the heat sink.

64 Claims, 6 Drawing Sheets

OTHER PUBLICATIONS

*Effects of electric and magnetic fields on the convective heat transfer in gaseous $O_2$ and $N_2O$* by M.F. Haque, E.E. Anderson, and E. Blums, J. Appl. Phys. 63 (8), Apr. 15, 1988, pp. 3561-3562.

*Control of heat transport in heat pipes by magnetic fields* by S. Ueno, S. Iwaki, and K. Tazume, J. Appl. Phys. 69 (8), Apr. 15, 1991, pp. 4925-4927.

*Microgravity experiments on thermomagnetic convection in magnetic fluids* by Stefan Odenbach, Journal of Magnetism and Magnetic Materials 149 (1995) pp. 155-157.

*Magnetic Heat Exchange Experiment* (Internal Boeing Document) by Brian Tillotson, Boeing Information, Space & Defense Systems, Huntsville, AL, Dec. 4, 1997, pp. 1-14.

*Fundamentals of Heat Transfer* by Alan J. Chapman, copyright © 1987, Macmillan Publishing Company, pp. 380-384.

*Heat Transport in Microgravity via Magnetothermal Convection* by Janice Houston and Brian Tillotson, Payload Technology Development, Boeing Defense & Space Group, Huntsville, AL, Copyright © 1996, pp. 1-7.

* cited by examiner

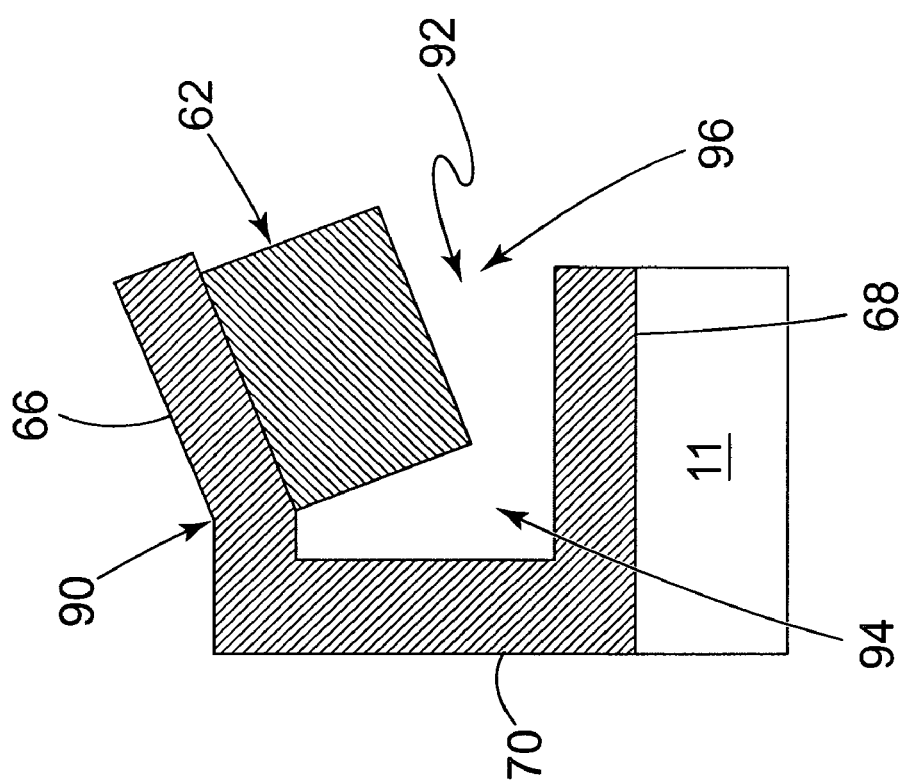
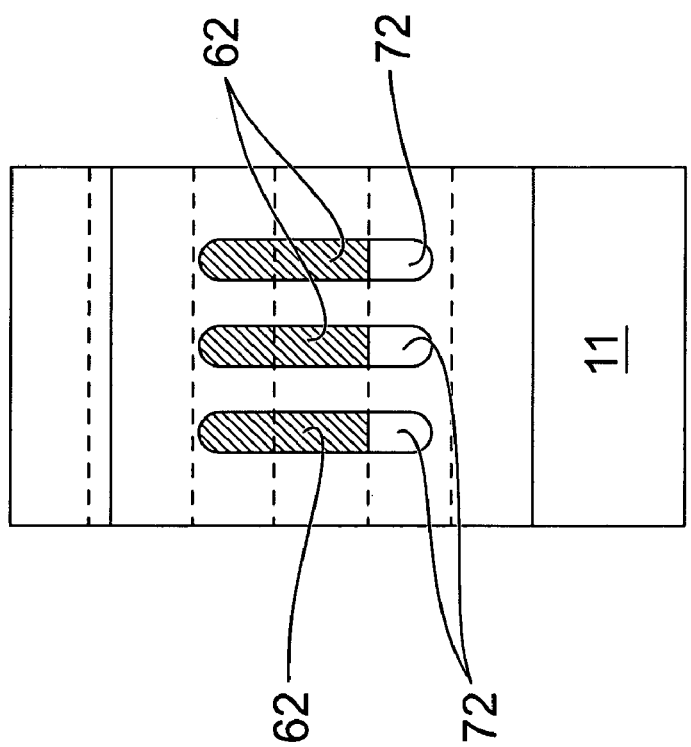
Fig. 11
Fig. 10

MAGNETICALLY ENHANCED CONVECTION HEAT SINK

BACKGROUND OF THE INVENTION

This invention is directed to a heat sink, and more specifically a heat sink for dissipating heat from a heat source by magnetically enhanced convection.

Dissipating heat from electrical and electronic systems and devices is a technical issue affecting cost and performance throughout the electronic industry. With respect to the aerospace industry in particular, where the use of electronic devices is prevalent, the problem of dissipating heat from these devices is of major concern due to the limitations on space and available power. In the absence of gravity aboard orbiting spacecraft, heat dissipation must rely on radiative or conductive transport, forced convection, or heat pipes. Radiation is inefficient at low and moderate temperatures such as those encountered aboard the International Space Station or other space craft. Conduction is usually inefficient, and even when efficient it imposes a mass penalty in the form of metal conduction paths. Forced convection requires the use of power which is at a premium in many aerospace and other applications, and often generates undesirable vibration and noise. Heat pipes usually cannot be used within an electronics assembly.

Heat sinks for electronics commonly use all three types of heat dissipation or transport, i.e., radiation, conduction, and convection. A typical heat sink is a black, finned mass of aluminum that is bolted or glued to the electronic device. Typically, such heat sinks have a rough black surface to enhance the radiative heat rejection. The use of fins on the heat sink improves contact with the air, and therefore enhances convection heat rejection. The choice of aluminum gives high thermal conductivity from the electronic device to the fins and radiating surfaces. Also, there is a small amount of conduction through the air itself. In many cases, conduction through the air is insignificant, and radiant heat rejection is often insufficient when temperatures are kept within the operating temperature range of most electronics. Furthermore, radiant transfer is often reduced due to the presence of other hot radiating surfaces within the heat sink's field of operation. Thus, convection is the means most often used to accomplish the required heat rejection.

Cost and performance drive electronic designers to increase the packing density of electronic components on circuit boards and within individual chips. This increases the heat generated per unit area. To increase convective heat rejection enough to meet the increased load, designers often use fans to force a higher flow rate of air over the circuit. However, cooling fans add noise, cost, weight, and power usage, and represent one of the major sources of failure in modern avionics. In some cases requiring extremely high packing density, designers use a circulating liquid to radically increase convective transfer from a circuit. However, the requisite fluid pumps, hoses, and chillers add greatly to system mass, cost, and maintenance needs. The problem of providing sufficient convection is particularly acute where the electronics are operating in a microgravity environment, such as an orbiting space craft, where gravity-driven convection is not present.

This invention addresses and overcomes these problems by providing an apparatus and method for enhancing convection cooling of electronic devices by the use of magnetothermal convection (MTC).

SUMMARY OF THE INVENTION

The invention is directed to an apparatus and method for enhancing convection cooling of electronic devices by exploiting the paramagnetic property of air. Air is paramagnetic, i.e., it is attracted to a magnet, and cool air is attracted to a magnet more strongly than hot air. The invention makes use of these properties in a heat sink that produces a magnetic gradient to enhance the flow of air past and away from a heat sink member. The invention is an improvement over current approaches for removing heat from circuits where simple convection is inadequate. Unlike fans or heat pipes, a preferred heat sink of the present invention using permanent magnets to create a magnetic gradient and magnetic driving force has no vibration, no acoustic noise, no electromagnetic interference, no power consumption, and no bearings or moving parts. It has no toxic materials and fits onto an electronic package in much the same way as a conventional heat sink. It also reduces the weight, volume, and failure rate of electronic assemblies. The heat sink of the invention can be configured to accommodate various applications.

Further features and advantages of the present invention, as well as the structure and operation of various embodiments of the present invention, are described in detail below with reference to the accompanying drawings.

BRIEF DESCRIPTION OF THE DRAWINGS

FIG. 10 is a rear elevational view similar to FIG. 2 of another preferred embodiment of the invention.

FIG. 11 is a side sectional view of FIG. 10.

DETAILED DESCRIPTION OF THE PREFERRED EMBODIMENTS

Figure 2:
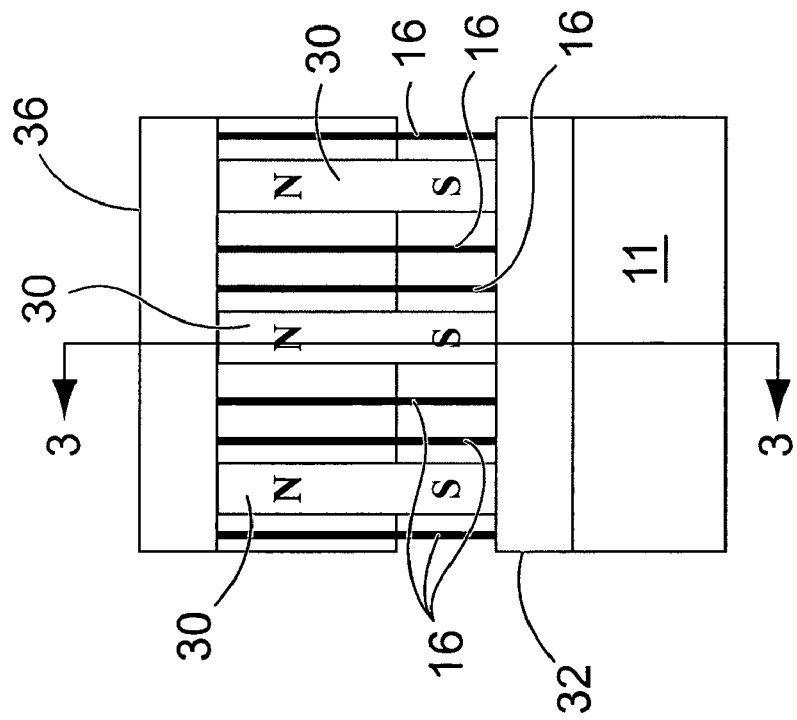
FIG. 2 is a rear elevational view of a magnetically enhanced convection heat sink of the present invention.

With reference to the drawing, there is shown a magnetically enhanced convection heat sink 10 in accordance with a preferred embodiment of the invention for dissipating heat from a heat source 11 which may be an electronic device. The heat sink 10 comprises a heat sink member 12 and magnetic source 14. The heat sink member 12 includes a plurality of fins 16 arranged in parallel spaced apart relationship as shown. Each fin has major side surfaces 20. The fins are essentially thin sheets, as is customary with conventional, non-magnetically enhanced heat sinks, to provide large surface areas in contact with the air without requiring large mass. The thickness of the fins depends on the particular application taking into account the physical size of the heat sink, the heat flux through each fin, and the mechanical stress exerted on the fins. Thus, depending on the particular application for the heat sink, the fins may be of a foil thickness, or substantially thicker and more substantial. In this preferred embodiment the fins are of aluminum, but may be of other materials that have good thermal conductivity, examples of which are copper, silver, gold, beryllium and pitch-based carbon fibers. The fins, which function to improve heat transfer from the heat source to the air, are of non-magnetic material so as not to short-circuit the magnetic flux as will be further explained. The materials for the fins, and their shapes, sizes, and thicknesses, are selected depending on the particular application for the heat sink to have adequate strength, good thermal conductivity, and high emissivity, and be non-oxidizing in warm air, electrochemically compatible with other materials with which the heat sink is to be used, tolerant of whatever chemical contaminants may be present where the heat sink is used, non-outgassing, non-ferromagnetic, and cost effective.

In this preferred embodiment the magnetic source 14 includes permanent magnets 30. Each magnet is generally rectangular and the magnets are arranged in spaced apart parallel relation as shown. One pole of each of the magnets is secured to a component 32, and the other pole of each of the magnets is secured to a component 34. The components 32, 34 (pole pieces) are of a magnetic material, such that they channel the magnetic flux from the permanent magnets 30. In accordance with this preferred embodiment, the magnets are of a high-coercivity material, such as samarium cobalt for high temperature uses or neodymium iron boron for more moderate temperatures. For the components 32, 34, the material used should have a high magnetic permeability for conducting the magnetic flux from the magnets to where the flux is concentrated as will be further described. Soft iron is such a material and may be used for the components 32, 34. In this preferred embodiment the magnets are rectangular as rectangular magnets are relatively inexpensive and relatively easy to assembly to make good contact with the components 32, 34. They have the further advantage over cylindrical magnets with the same total flux of not blocking the air flow to as great an extent.

The component 32 is flat throughout its length to establish good thermal contact with heat source 11, while the component 34 has a flat portion 36 and a curved portion 38. The portion 38 curves inwardly toward the portion 32 from the end of the portion 38 to the front end of the heat sink, such that the spacing between the components 32, 34 is closer near a first location 40 where air enters the heat sink than near a second location 42 downstream from the first location.

The fins 16 are secured between the components 32, 34 at the upstream end of the heat sink, and are shaped as shown in FIGS. 1–4 to accommodate the shape of the components 32, 34. The magnets 14 are located at the downstream end of the fins and also are secured between the components 32, 34. The parallel spacing of the fins and magnets are such as to allow the free flow of air through the heat sink past the fins and magnets. Thus, the heat sink member 12 is positioned within the magnetic field and in the airflow path between the location 40 and 42.

In operation, the magnets 14 and associated magnetic components 32, 34 create a magnetic field which is concentrated at the first location 40 where the spacing between the components 32, 34 is smallest. This intensified magnetic field at location 40 magnetically attracts cooler air toward the front of the heat sink. Heat from the heat source 11 is conducted to the fins 16 to heat the fins. The cool air attracted to the front end of the heat sink is heated at that location by contact with the fins. As the air gets warmer, it is displaced from the intense field region by more paramagnetic cool air at the front of the heat sink, thereby pushing the warm air to the left as shown by the arrows in FIGS. 3 and 5. As the warm air moves to the left, it acquires increasingly more heat from the fins, and finally passes between the magnets to exit the heat sink. The smoothly curved portion 38 of the component 34, creating a smoothly decreasing magnetic field from the first location 40 to the second location 42, creates a smooth magnetic gradient between the first and second locations that drives the air through the heat sink.

The heat sink 10, with the curved portion 38 of the component 34 and the corresponding shapes of the fins 16, provide a relatively constant volumetric magnetic force to drive the air from the location 40 where the magnetic flux is concentrated, through the heat sink as the magnetic flux diminishes to a lower concentration at the downstream location 42. While a magnetic gradient can be achieved over a small distance through the heat sink, for example, 3–4 millimeters, without the curved configuration as described, or for that matter using only the magnets 14 without the components 32, 34, cooling is improved where, as in accordance with this preferred embodiment, the magnetic flux is concentrated near the surface to be cooled, and the incoming heat pushes the air along the magnetic gradient. These factors are achieved in accordance with the preferred embodiment by the components 32, 34 which concentrate the magnetic flux near the hot surface of the heat source 11, and by the curvature of the component 34 such that the volumetric force coefficient [H∇H] is fairly constant in the upstream region defined by the curved portion 38 where the incoming air is still relatively cool. Since the magnetic field H is roughly inversely proportional to the distance across the gap, i.e., the vertical distance between the components 32, 34, in a preferred embodiment of the invention it is preferable that the width of the gap as a function of distance (x) from a given location along the length of the components 32, 34, be defined as $1/(\sqrt{x})$, where "sqrt" means "square root of". With the curved portion 38 of the component 34 so defined, H varies as $(\sqrt{x})$, and ∇H varies as $1/(\sqrt{x})$, so that [H∇H] is approximately constant. So configured, a substantially constant volumetric force is exerted on the air as it moves through the heat sink, much the same as gravity would exert a substantially constant volumetric force on air moving through a heat sink solely by the force of gravity. Moreover, it is to be understood that an optimal configuration should account for drag on the air moving through the device and the reduced magnetic susceptibility of hotter air, factors that may be addressed through computer modeling or empirical analysis. For a preferred embodiment the magnetic gradient is in the order of 1 Tesla/cm, although a lesser or greater gradient may be provided.

Figure 5:
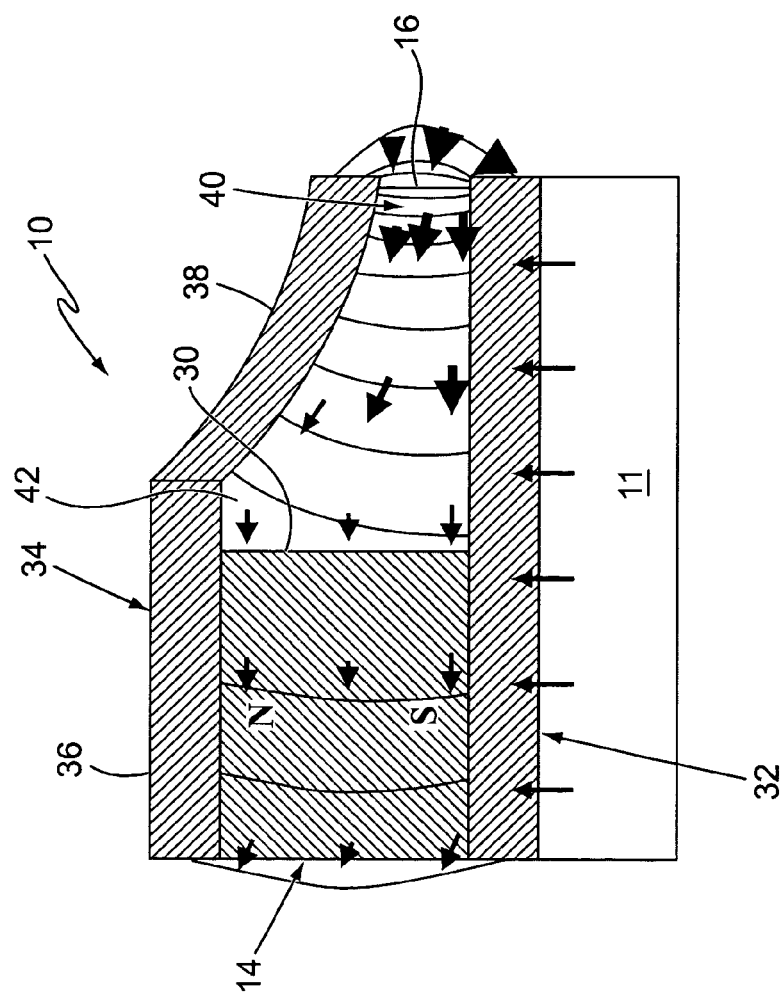
FIG. 5 is a sectional view similar to FIG. 3 illustrating heat flow, airflow and the magnetic field in accordance with a preferred embodiment of the invention.

The magnetic field generated by the heat sink in accordance with this preferred embodiment is illustrated by the field lines shown in FIG. 5. The magnets 14 have dense field lines generally vertically oriented within the body of each magnet. These field lines spread out in the components 32, 34 and bend toward locations 42, 40. Most of the field lines get nearly to the end of the components 32, 34 and cross the gap at location 40 creating a strong concentration of magnetic flux at location 40 with the field lines going generally vertically between components 32, 34 at that location. The density of the field lines, i.e., the concentration of the magnetic flux, decreases from the location 40 to the location 42. As illustrated, some of the field lines bulge outwardly at the location 40. In this preferred embodiment, the field strength at the location 40 is about 0.5 Tesla to about 1.0 Tesla. Higher field strengths may be achieved, such as by narrowing the gap between the components 32, 34 at location 40, but this leaves less room for airflow into the heat sink which must be taken into consideration in achieving maximum cooling efficiency for a particular application.

In a preferred embodiment, the heat sink may operate in a temperature range from the boiling point of air (approximately 80 Kelvin) to the Curie temperature of the ferromagnetic materials used in the device (as high as 1400 Kelvin for Cobalt). The magnetically enhanced heat sink of the invention has significantly greater heat dissipation than a comparable heat sink without magnetic enhancement. In normal earth gravity the heat dissipation with magnetic enhancement is roughly twice that of a comparable heat sink without magnetic enhancement, and in zero gravity is roughly 100 times greater.

FIG. 5 also generally illustrates the airflow through the heat sink 10. In accordance with the invention, convection is due to changes in the air's magnetic susceptibility, $\chi$, as temperature changes in accordance with: $f=\chi(T)\mu_0 H\nabla H$, where f is volumetric magnetic force, $\chi$ is air susceptibility, $\mu_0$ is the permeability of free space, T is temperature, and H is magnetic field strength. For a typical paramagnetic gas such as air, $\chi$ decreases as temperature increases, so cool gas is more attracted to strong magnetic fields than warm gas. As illustrated in FIG. 5, the lower vertical arrows represent heat from the heat source 11. The shorter arrows, pointed generally from right to left, show the airflow through the heat sink due to the magnetic gradient. The wider arrows indicate higher speed such that the fastest airflow is in the narrow gap region at location 40, and the airflow slows as the gap between the components 32, 34 widens. Cool air is pulled into the heat sink at the location 40 by the magnetic gradient, then is heated by the fins 16 and pushed to the left by the magnetic gradient in the diverging region toward the location 42 and then on through the heat sink to exit at the left end of the heat sink. Thus, cool air is attracted to the region with low potential energy, i.e., location 40, where it gains heat. When heated, it is less attracted to the low energy region, and therefore is displaced with cooler air. The warm air moves up the potential energy gradient, gaining heat as it goes.

Not shown in FIG. 5 are the effects of air movement due to gravity where the heat sink 10 is located in a gravitational field with the field directed vertically downwardly with reference to FIG. 5. In such a situation, combined effects of magnetic and gravitational convection create a swirling flow as cooler air moves to the hot side, i.e., the location of the heat source 11, under the force of gravity, is then heated and then rises.

Figure 1:
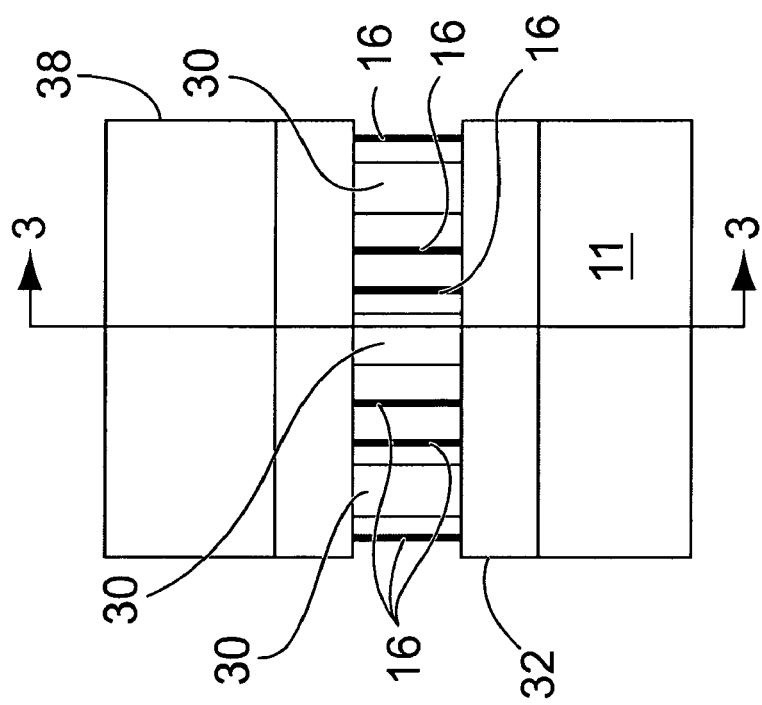
FIG. 1 is a schematic front elevational view of a magnetically enhanced convection heat sink in accordance with a preferred embodiment of the invention.
Figure 3:
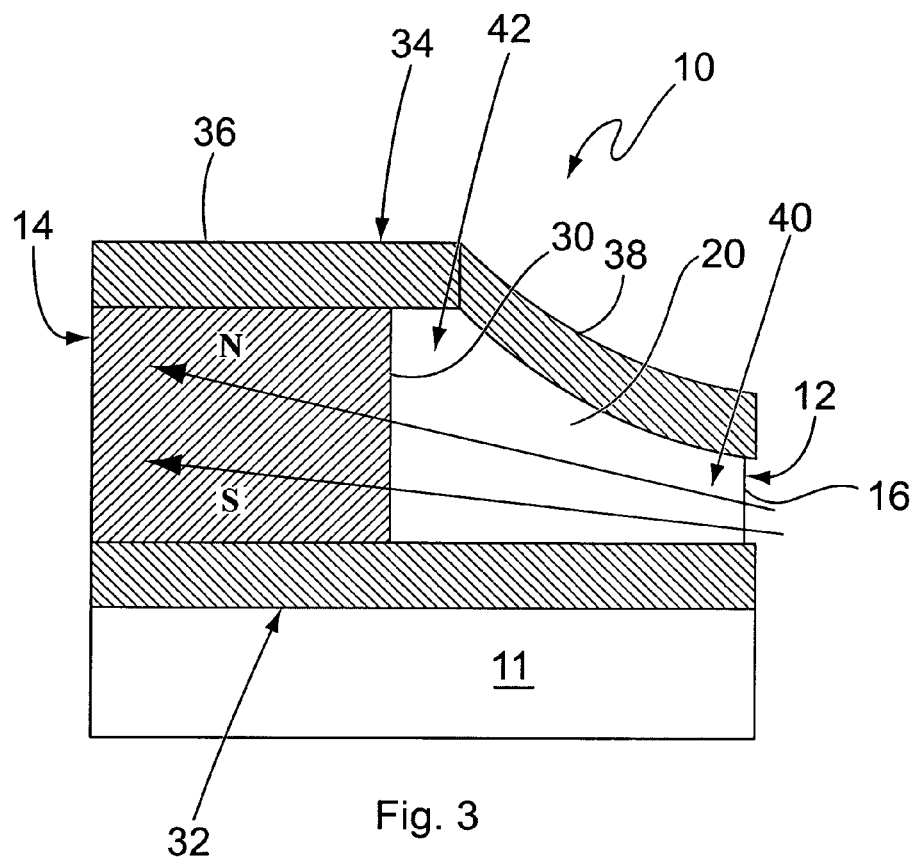
FIG. 3 is a sectional view taken along the line 3—3 of FIGS. 1 and 2.
Figure 4:
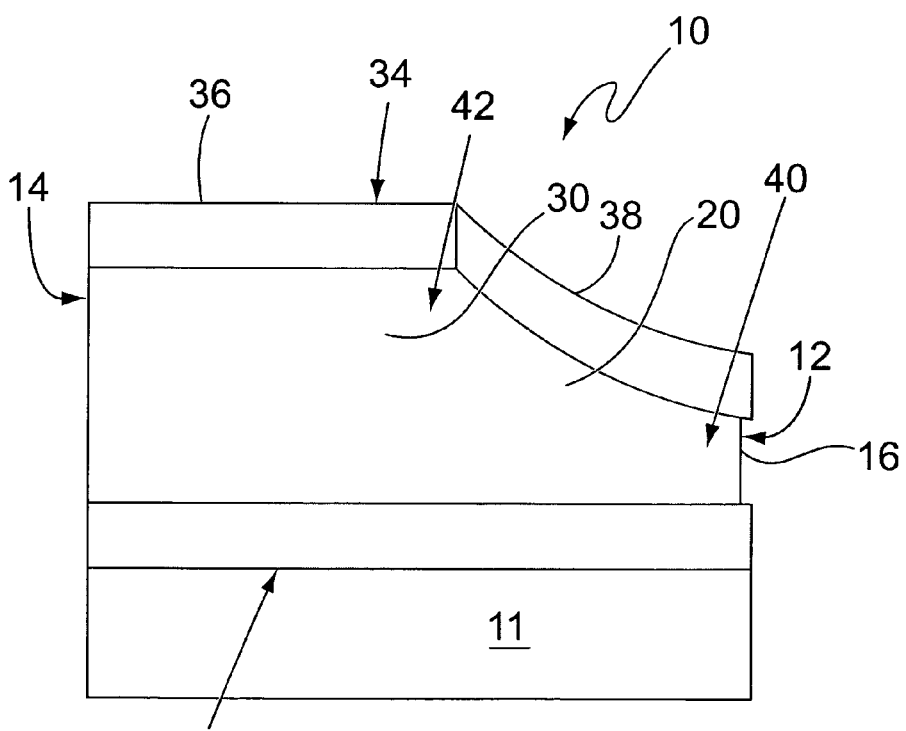
FIG. 4 is a right side elevational view of the heat sink of FIG. 2.

The magnets 14 are spaced laterally from each other as shown in FIGS. 1 and 2 to spread the magnetic flux generally evenly across the components 32, 34 so as not to become overly saturated at some locations thereby carrying the magnetic flux less effectively. The greater the number of magnets and the greater their size, the greater the magnetic gradient to drive the air through the heat sink. However, the number, size, and spacing of the magnets also affects the sizes of the air passages, such that a greater number of magnets or magnets of larger size will occupy more space in a given heat sink and thereby reduce the sizes of the air passages, thus restricting airflow. With these opposing factors, the number, size, and spacing of the magnets are selected for a particular application of the heat sink to achieve optimum performance. This can be done by constructing physical models and running appropriate performance tests on the models, or by computer modeling using a simulation program that incorporates aerodynamics, heat transfer, magnetothermal convection, and magnetic field modeling.

In the preferred embodiment, the outermost magnets 14 are positioned inwardly of the side edges of the components 32, 34, and the outermost fins 16 are spaced outwardly of the outermost magnets and somewhat inwardly of the side edges of the components 32, 34. Placement of the outermost magnets inwardly of the side edges of the components 32, 34 helps to couple the magnetic flux from the magnets into the components 32, 34 with less flux leakage. Flux from the outermost magnets spreads inboard and outboard into the components. Placing the magnets at the edge of the components would require all of the flux from the outermost magnets to propagate inboard which could saturate the edges of the components and cause flux leakage. The outermost fins are spaced outwardly from the outermost magnets to intercept the cooler air attracted by the magnetic flux at the outermost locations, thereby cooling the outermost fins.

Figure 6:
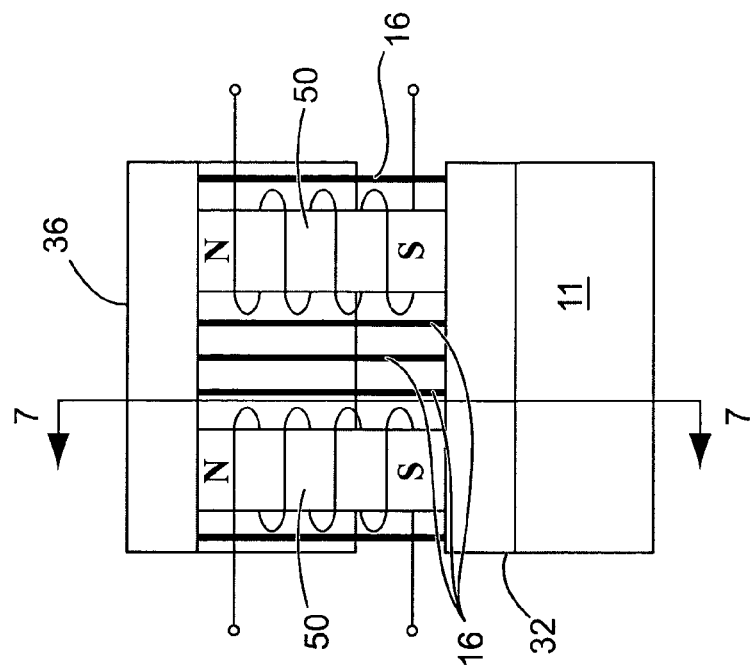
FIG. 6 is a rear elevational view similar to FIG. 2 of another preferred embodiment of the invention.
Figure 7:
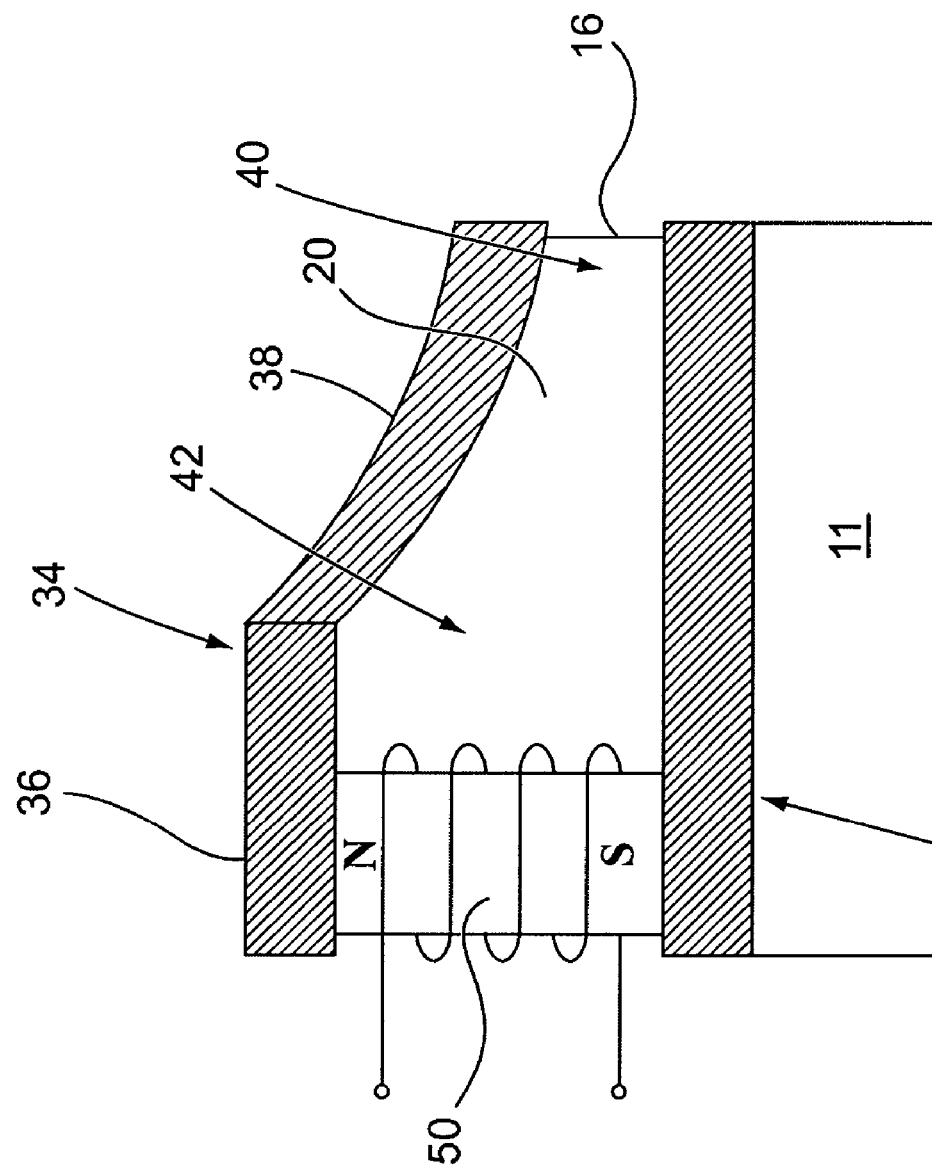
FIG. 7 is a sectional view taken along the line 7—7 of FIG. 6.

While the embodiments of FIGS. 1–5 use permanent magnets, electromagnets may also be used. FIGS. 6 and 7 illustrate an embodiment similar to that of FIGS. 1–5 but using electromagnets 50. In essence, the electromagnets work like the permanent magnets. Power to the electromagnets may be supplied by any suitable power source which may be the same power source that powers the electronics of the heat source 11. Moreover, the electronics of the heat source 11 may include induction coils as part of its circuitry which may be used in a dual function to produce the magnetic flux gradient in a heat sink constructed integrally with the electronics. This may be accomplished where the induction coils are discreet components, incorporated into a circuit board, or etched into an electronic chip. The core of the electromagnet may be part of the components 32, 34, thereby in some cases requiring fewer manufacturing steps.

The electromagnets can be either AC or DC powered, although AC power generates somewhat higher waste heat due to eddy currents in the cores of electromagnets and the components 32, 34. In some cases the frequency of the AC power resonates with the acoustic modes of the heat sink device or the container in which the device is installed. In such cases the alternating magnetic "push and pull" on the air resonates with the acoustic modes, causing increased airflow through the heat sink.

Electromagnets are advantageous in some applications. Examples include applications where it is important that the magnet not attract loose objects within the environment where the heat sink is located, or where the heat sink is used to actively control the temperature of the heat source rather than functioning to dissipate as much heat as possible from the heat source. With this latter example, the power to the electromagnets in the heat sink is adjusted in response to a temperature sensor that senses the temperature of the heat source and a feedback circuit to increase or decrease the flow of air through the heat sink to maintain the heat source at a selected temperature.

Of course, electromagnets themselves generate resistance heat which must also be removed by air moving through the heat sink such that the heat sink performs its function of sufficiently dissipating the heat from the heat source.

Figure 9:
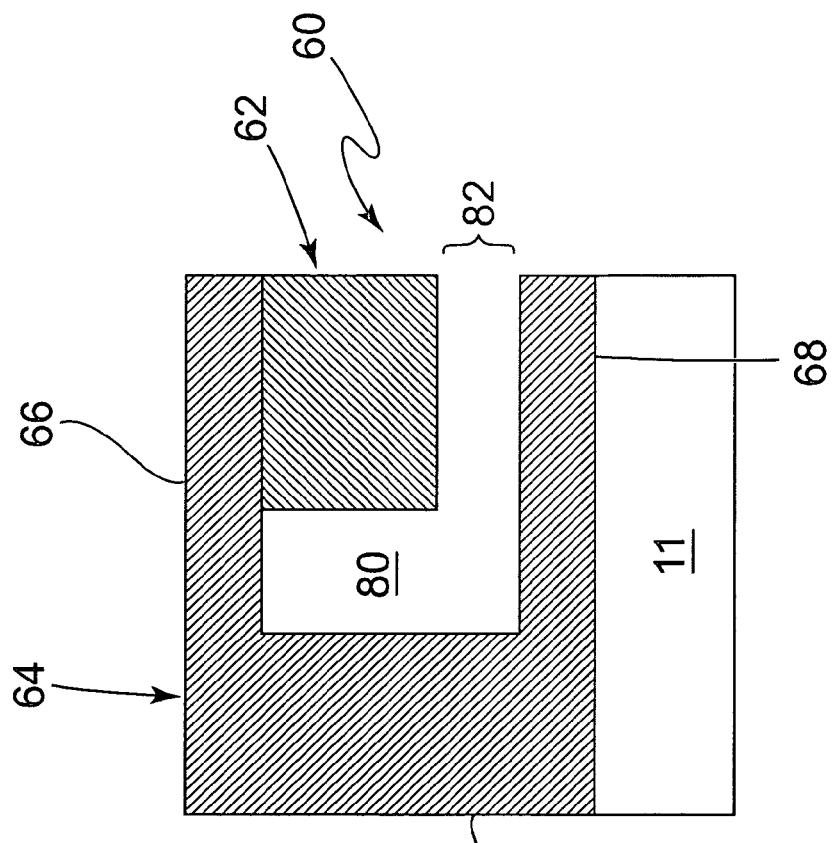
FIG. 9 is a side sectional view of FIG. 8.
Figure 8:
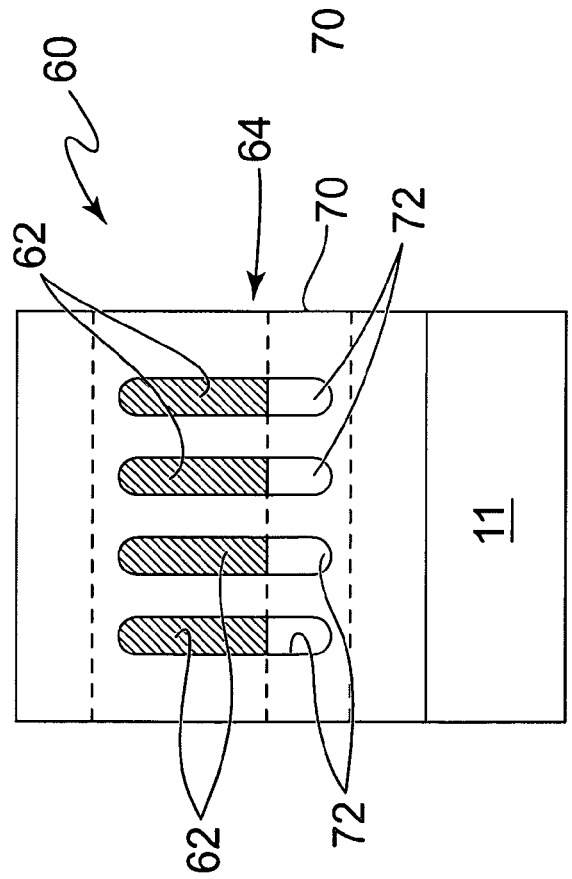
FIG. 8 is a rear elevational view similar to FIG. 2 of another preferred embodiment of the invention.

FIGS. 8–11 illustrate further embodiments of the invention. With reference to FIGS. 8 and 9, there is shown a heat sink 60 for dissipating heat from a heat source 11, the heat sink comprising a magnet 62 and a component 64. In this described embodiment, the magnet 62 is a permanent magnet, but as with the previously described embodiments the magnet may also be an electromagnet. The component 64 is similar to the components 32, 34 of the previously described embodiment, but rather than being of a two-piece construction, the component 64 is of generally U-shape, one-piece construction having generally parallel portions 66, 68 joined at one end by a portion 70. In this described embodiment, the portion 70 has elongated openings 72. The magnet 62 is similar to the magnets 14, but in this described embodiment is a single magnet mounted to the portion 66 of the component 64 at the end of the component 66 opposite the portion 70, thereby forming a generally L-shaped space 80 between the magnet 62 and component 64. The lower surface of the magnet 62 (as viewed in the drawings) is generally parallel to the portion 68 of the component 64 such that the gap 82 formed between the magnet and the portion 68 is generally constant over the length of the magnet as shown in FIG. 9.

The operation of the embodiment of FIGS. 8 and 9 is similar to that of the previously described embodiments, but uses a single pole piece (component) to channel the magnetic flux. The component 64 is U-shaped to carry the flux from one pole of the magnet to near the other pole. The magnetic field is strongest in the narrow gap 82 between the magnet and the portion 68 of the U-shaped component to attract the cooler air and create a convection air flow from the right side of the heat sink (as viewed in FIG. 9), through the gap 82, and exiting through the openings 72.

The openings 72, although not required, provide improved air flow through the heat sink. As shown in FIG. 9, the portion 70 of the component 64 is thicker than the components 66, 68 to keep the cross-section of the component 64 more constant even with the inclusion of the openings to reduce flux leakage.

FIGS. 9 and 10 illustrate a modification of the heat sink embodiment of FIGS. 8 and 9. With the heat sink of FIGS. 9 and 10, the portion 66, rather than being parallel to the portion 68, has a bend at 90, and from that location extends away from the portion 68, as does the lower surface of the magnet 62 which is mounted to the extending portion. This creates a gap 92 between the magnet and the portion 68 that increases in width from a first location 94 to a second location 96, thereby creating a magnetic gradient that drives warm air from the first location to the second location as cooler air enters the heat sink through the openings 72. As with the embodiment of FIGS. 8 and 9, the openings 72 in the embodiment of FIGS. 10 and 11, although not required, improve air flow through the heat sink.

In describing the various embodiments of the invention, reference has been made to "air" as the cooling gas. To be more precise, it is the oxygen in the air that for the most part possesses the paramagnetic property, although other components of air possess magnetic properties but of a much smaller magnitude. However, there is little, if any, difference between oxygen flow and air flow. For most applications the mean free path of molecules in air will be very small and the thermal energy of each molecule will be many orders of magnitude greater than the magnetic energy, so that the oxygen and nitrogen in the air remains mixed. The nitrogen is carried along with the oxygen and helps carry the heat given off by the heat source to the air. Nevertheless, it is to be understood that the invention is not limited solely to the use of air, but incorporates within its scope any gas, including oxygen alone, that possesses sufficient paramagnetic properties.

In the preferred embodiments the major surfaces 20 of the fins are oriented parallel to the direction of airflow. While the figures of the drawings as viewed show the airflow path to be generally horizontal, it is to be understood that the heat sink of this invention can be placed in any orientation depending on its particular application. For example, the heat sink of the present invention may be located in a gravitational field. In such circumstances it is preferred that the heat sink be oriented such that the first location 40 is lower in the gravitational field than the second location 42 so that the convection induced by the magnetic gradient is substantially aligned with the convection induced by gravity. Moreover, while a particular heat sink configuration has been described using rectangular magnets and cooling fins arranged in straight parallel relationship, it is to be understood that other configurations are within the scope of the invention and may be used depending on the particular application. These other configurations include circular and cylindrical configurations.

Thus, there has been described a magnetically enhanced convection heat sink which overcomes many of the problems associated with conventional convection heat sinks and with substantially improved performance.

While the present invention has been described by reference to specific embodiments and specific uses, it should be understood that other configurations and arrangements could be constructed, and different uses could be made, without departing from the scope of the invention as set forth in the following claims.

What is claimed is:

1. A magnetically enhanced convection heat sink for use with a gas that exhibits paramagnetic properties, said heat sink comprising:
    a heat sink member for dissipating heat from a heat source,
    a magnetic source creating a magnetic field concentrated at a first location, the intensity of the magnetic field decreasing from the first location to a second location, said heat sink member positioned within said magnetic field and in a gas flow path between the first location and the second location,
    said heat sink member heating said gas entering the heat sink at the first location, wherein as the gas becomes warmer the gas is displaced by cooler gas causing the warmer gas to move toward the second location as it is further heated by the surface of the heat sink.

2. The magnetically enhanced convection heat sink of claim 1 wherein said gas has the paramagnetic properties substantially the same as oxygen.

3. The magnetically enhanced convection heat sink of claim 1 wherein said gas includes oxygen.

4. The magnetically enhanced convection heat sink of claim 1 wherein said gas is air.

5. The magnetically enhanced convection heat sink of claim 1 wherein the heat sink member further comprises a plurality of fins.

6. The magnetically enhanced convection heat sink of claim 5 wherein the fins are in contact with the gas flow moving through the heat sink from the first location to the second location.

7. The magnetically enhanced convection heat sink of claim 1 wherein the magnetic source further comprises a permanent magnet.

8. The magnetically enhanced convection heat sink of claim 1 wherein the magnetic source further comprises an electromagnet.

9. The magnetically enhanced convection heat sink of claim 1 further comprising first and second components magnetically coupled with said magnetic source, said components being spaced apart such that the spacing between the components is greater at the second location than the first location, said magnetic source producing a magnetic field between said components, and said heat sink member positioned between said components.

10. The magnetically enhanced convection heat sink of claim 9 wherein at least one of said components has a portion that curves away from the other component from the first location to the second location, thereby creating a magnetic gradient that drives the gas through the heat sink.

11. The magnetically enhanced convection heat sink of claim 5 wherein said fins have major heat dissipating surfaces, said major heat dissipating surfaces generally parallel to the direction of gas flow through the heat sink.

12. The magnetically enhanced convection heat sink of claim 1 wherein the heat sink member is of a thermally conductive material such as aluminum.

13. The magnetically enhanced convection heat sink of claim 9 wherein said components are of a ferromagnetic material such as iron.

14. The magnetically enhanced convection heat sink of claim 1 wherein said magnetic source is thermally connected to said heat sink member and is located within the gas flow from the first location to the second location.

15. The magnetically enhanced convection heat sink of claim 9 wherein said magnetic source further comprises a plurality of magnets positioned in spaced apart relation relative to each other, the spacing of the magnets being such that the magnetic flux is spread generally evenly across said components.

16. The magnetically enhanced convection heat sink of claim 15 wherein said magnets are spaced apart in a generally lateral direction relative to said gas flow path.

17. The magnetically enhanced convection heat sink of claim 9 wherein said magnetic source further comprises a plurality of spaced apart magnets magnetically coupled with said first and second components, said components having lateral outside edges, said magnets being generally laterally spaced relative to each other with the outermost magnets positioned inwardly from said lateral outside edges of said components.

18. The magnetically enhanced convection heat sink of claim 17 wherein said heat sink member further comprises a plurality of fins positioned within spaces between said magnets, said magnets and fins being located within the gas flow from the first location to the second location.

19. The magnetically enhanced convection heat sink of claim 18 wherein at least one of said fins is located laterally outwardly of the outermost of said magnets.

20. The magnetically enhanced convection heat sink of claim 10 wherein said magnetic gradient is greater than about 1 Tesla/cm.

21. The magnetically enhanced convection heat sink of claim 20 wherein the magnetic field strength at said first location is greater than about 0.5 Tesla.

22. The magnetically enhanced convection heat sink of claim 1 wherein said heat source is an electronic device.

23. The magnetically enhanced convection heat sink of claim 1 wherein:
the heat sink is located in a gravitational field,
the heat sink being oriented such that the first location is lower in the gravitational field than the second location so that the convection induced by the magnetic field is substantially aligned with the convection induced by gravity.

24. A magnetically enhanced convection heat sink for use with a gas that exhibits paramagnetic properties, said heat sink comprising:
a heat sink member for dissipating heat from a heat source,
a magnetic source creating a magnetic field, said heat sink member positioned within said magnetic field and in a gas flow path between a first location and a second location,
said heat sink member heating said gas entering the heat sink at the first location, wherein as the gas becomes warmer the gas is displaced by cooler gas causing the warmer gas to move toward the second location as it is further heated by the surface of the heat sink.

25. In combination a heat source generating heat, and a magnetically enhanced convection heat sink for use with a gas that exhibits paramagnetic properties, said combination comprising:
a heat source generating heat;
a magnetically enhanced convection heat sink, said heat sink further comprising:
a heat sink member for dissipating heat from said heat source,
a magnetic source creating a magnetic field concentrated at a first location, the intensity of the magnetic field decreasing from the first location to a second location, said heat sink member positioned within said magnetic field and in said gas flow path between the first location and the second location,
said heat sink member heating said gas entering the heat sink at the first location, wherein as the gas becomes warmer the gas is displaced by cooler gas causing the warmer gas to move toward the second location as it is further heated by the surface of the heat sink thereby cooling said heat source.

26. The combination of claim 25 wherein said heat source is an electronic device.

27. The combination of claim 25 wherein said heat sink is configured to create a magnetic gradient that drives the air through the heat sink.

28. The combination of claim 26 wherein said gas has paramagnetic properties substantially the same as oxygen.

29. The combination of claim 28 wherein said gas includes oxygen.

30. The combination of claim 26 wherein said gas is air.

31. The combination of claim 26 wherein the heat sink member further comprises a plurality of fins.

32. The combination of claim 31 wherein the fins are in contact with the gas flow moving through the heat sink from the first location to the second location.

33. The combination of claim 32, said heat sink further comprising first and second components magnetically coupled with said electronic device, said components being spaced apart such that the spacing between the components is greater at the second location than the first location, said magnetic source producing a magnetic field between said components, and said heat sink member positioned between said components.

34. The combination of claim 33 wherein at least one of said components has a portion that curves away from the other component from the first location to the second location, thereby creating a magnetic gradient that drives the gas through the heat sink.

35. The combination of claim 34 wherein the volumetric magnetic force that drives the gas through the heat sink is generally constant in at least a throat section where cooler gas enters the heat sink.

36. The combination of claim 35 wherein said fins have major heat dissipating surfaces, said fins positioned between said magnetic components with their major heat dissipating surfaces generally parallel to the direction of gas flow through the heat sink, and wherein said magnetic source is thermally connected to said heat sink member and is located within the gas flow from the first location to the second location.

37. A method of convecting heat from a heat source utilizing a gas that exhibits paramagnetic properties, said method comprising the steps of:
   providing a heat sink member for dissipating heat from said heat source;
   creating a magnetic field concentrated at a first location, the intensity of the magnetic field decreasing from the first location to a second location;
   positioning said heat sink member within said magnetic field and in said gas flow path between the first location and the second location,
   said heat sink member heating said gas entering the heat sink at the first location, wherein as the gas becomes warmer the warmer gas is displaced by cooler gas causing the warmer gas to move toward the second location as it is further heated by the surface of the heat sink.

38. The method of claim 37 wherein the heat sink member further comprises a plurality of fins, said method further comprising the step of positioning said fins in contact with the gas flow moving through the heat sink from the first location to the second location.

39. The method of claim 37 further comprising the step of creating a magnetic gradient that drives the gas from the first location to the second location.

40. The method of claim 39 further comprising the step of locating a magnetic source within the gas flow from the first location to the second location.

41. The method of claim 40 wherein said magnetic gradient produces a substantially constant force that drives the gas from the first location to the second location.

42. The method of claim 37 wherein the said heat sink member has a thermal conductivity on the order of a metal such as aluminum.

43. An assembly for dissipating heat in a gas environment where the gas exhibits paramagnetic properties, said assembly comprising:
   a heat source;
   a magnetic source creating magnetic fields at first and second locations, the magnetic field created at said first location being stronger than the magnetic field created at said second location, thereby causing gas to flow from said first location to said second location;
   said heat source thermally coupled with a heat dissipating surface positioned within the gas flow between said first and second locations.

44. The assembly of claim 43 wherein said heat source is thermally coupled with said heat dissipating surface by direct thermal contact with said surface.

45. The assembly of claim 43 wherein said magnetic source further comprises a permanent magnet.

46. The assembly of claim 43 wherein said magnetic source further comprises an electromagnet.

47. A magnetically enhanced convection heat sink for use with a gas that exhibits paramagnetic properties, said heat sink comprising:
   a magnetic source;
   at least one component magnetically coupled with said magnetic source;
   said magnetic source and said at least one component being configured to channel magnetic flux to a gap where the magnetic flux is concentrated, said gap being located within a gas flow path through the heat sink.

48. The magnetically enhanced convection heat sink of claim 47 wherein said at least one component further comprises a U-shaped member having first and second portions, said magnetic source being mounted to one of such portions and creating a gap with the other of said portions, said gap being located within said gas flow path.

49. The magnetically enhanced convection heat sink of claim 48 wherein said U-shaped member has openings in a wall thereof, said openings being located within said gas flow path to facilitate the movement of gas through the heat sink.

50. The magnetically enhanced convection heat sink of claim 48 wherein said gap is of generally constant width over the length of the magnetic source in the general direction of gas flow through the gap.

51. The magnetically enhanced convection heat sink of claim 48 wherein the width of said gap increases from a first location to a second location in the general direction of the gas flow through the gap.

52. The magnetically enhanced convection heat sink of claim 1, wherein the magnetic source further comprises an induction coil of the heat source.

53. The magnetically enhanced convection heat sink of claim 1, wherein the heat sink is shaped and dimensioned such that the heat sink has an acoustic mode having a first frequency associated therewith, the magnetic field having a second frequency therewith, the first and the second frequencies causing the magnetic field to resonate with the acoustic mode, whereby airflow through the heat sink increases.

54. The magnetically enhanced convection heat sink of claim 1, wherein the magnetic source further comprises an electromagnet powered by a power supply adapted to respond to a temperature of the heat source to maintain the heat source at a pre-selected temperature.

55. The combination of claim 26, wherein the magnetic source further comprising an induction coil of the electronic device.

56. The combination of claim 25, wherein the heat sink is shaped and dimensioned such that the heat sink has an acoustic mode having a first frequency associated therewith, the magnetic field having a second frequency therewith, the first and the second frequencies causing the magnetic field to resonate with the acoustic mode, whereby airflow through the heat sink increases.

57. The combination of claim 25, further comprising a power supply powering the magnetic source, the magnetic source being an electromagnet, the power supply responding to a temperature of the heat source to maintain the heat source at a pre-selected temperature.

58. The method of claim 37 wherein the creating a magnetic field further comprises using an induction coil of the heat source.

59. The method of claim 37 further comprising shaping and dimensioning the heat sink such that the heat sink has an acoustic mode associated therewith, and causing the magnetic field to resonate with the acoustic mode, whereby airflow through the heat sink increases.

60. The method of claim 37 further comprising adjusting the magnetic field in response to a temperature of the heat source to maintain the heat source at a pre-selected temperature.

61. The assembly of claim 43, wherein said magnetic source further comprises an induction coil of the heat source.

62. The assembly of claim 43, wherein the assembly is shaped and dimensioned such that the assembly has an acoustic mode having a first frequency associated therewith, the magnetic field having a second frequency therewith, the first and the second frequencies causing the magnetic field to resonate with the acoustic mode, whereby airflow through the assembly increases.

63. The assembly of claim 43, further comprising a power supply powering the magnetic source and adjusting the power in response to a temperature of the heat source to maintain the heat source at a pre-selected temperature.

64. The magnetically enhanced convection heat sink of claim 47, wherein the gas flow path is shaped and dimensioned such that the gas flow path has an acoustic mode having a first frequency associated therewith, the magnetic source having a second frequency therewith, the first and the second frequencies causing the magnetic field of the magnetic source to resonate with the acoustic mode, whereby airflow through the gas flow path increases.

* * * * *